(12) United States Patent
Chang

(10) Patent No.: US 9,578,145 B2
(45) Date of Patent: Feb. 21, 2017

(54) COUPLING FRAME AND METHODS FOR MAKING THE SAME

(71) Applicant: HON HAI PRECISION INDUSTRY CO., LTD., New Taipei (TW)

(72) Inventor: Shao-Han Chang, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 62 days.

(21) Appl. No.: 14/567,629

(22) Filed: Dec. 11, 2014

(65) Prior Publication Data
US 2016/0120057 A1 Apr. 28, 2016

(30) Foreign Application Priority Data
Oct. 22, 2014 (CN) .......................... 2014 1 0565496

(51) Int. Cl.
*H04M 1/02* (2006.01)

(52) U.S. Cl.
CPC ......... *H04M 1/0202* (2013.01); *H04M 1/0249* (2013.01)

(58) Field of Classification Search
CPC ........ G06F 1/16; G06F 1/1601; G06F 1/1613; H04M 1/0202; H04M 1/0249
USPC .............. 361/679.01, 679.21–679.3, 679.55, 361/679.56, 679.02; 455/575.1–575.9
See application file for complete search history.

(56) References Cited

U.S. PATENT DOCUMENTS

| | | | | |
|---|---|---|---|---|
| 6,532,152 | B1 * | 3/2003 | White | G02F 1/133308 312/223.1 |
| 7,418,282 | B2 * | 8/2008 | Nuovo | H04M 1/23 361/814 |
| 8,760,866 | B2 * | 6/2014 | Zadesky | H04M 1/0252 361/679.21 |
| 2004/0114318 | A1 * | 6/2004 | Nuovo | H04M 1/23 361/679.3 |

* cited by examiner

*Primary Examiner* — Anthony Haughton
(74) *Attorney, Agent, or Firm* — Zhigang Ma

(57) ABSTRACT

A coupling frame to provide structural support and electrical functionality includes a plurality of conductive frames spaced from each other and having predetermined gaps. A plurality of conductive sheets are electrically connected to the different places of the inside surface of the conductive frames and an insulating frame fills in the predetermined gaps. Each conductive frame and the insulating frame are annular structures. The insulating frame extends inwardly to partially cover the plurality of conductive sheets. A method for making the coupling frame is also provided.

17 Claims, 6 Drawing Sheets

COUPLING FRAME AND METHODS FOR MAKING THE SAME

FIELD

The subject matter herein generally relates to electrically insulating structures.

BACKGROUND

A frame of an electronic device is utilized by the inside circuitry, such as being utilized for an antenna of the electronic device. In order to make the frame meet different needs of the circuit, the frame needs to made of segments. Some metal segments are coupled together, and plastic is injected between the metal segments to create the complete frame.

BRIEF DESCRIPTION OF THE DRAWINGS

Implementations of the present technology will now be described, by way of example only, with reference to the attached figures.

DETAILED DESCRIPTION

Figure 1:
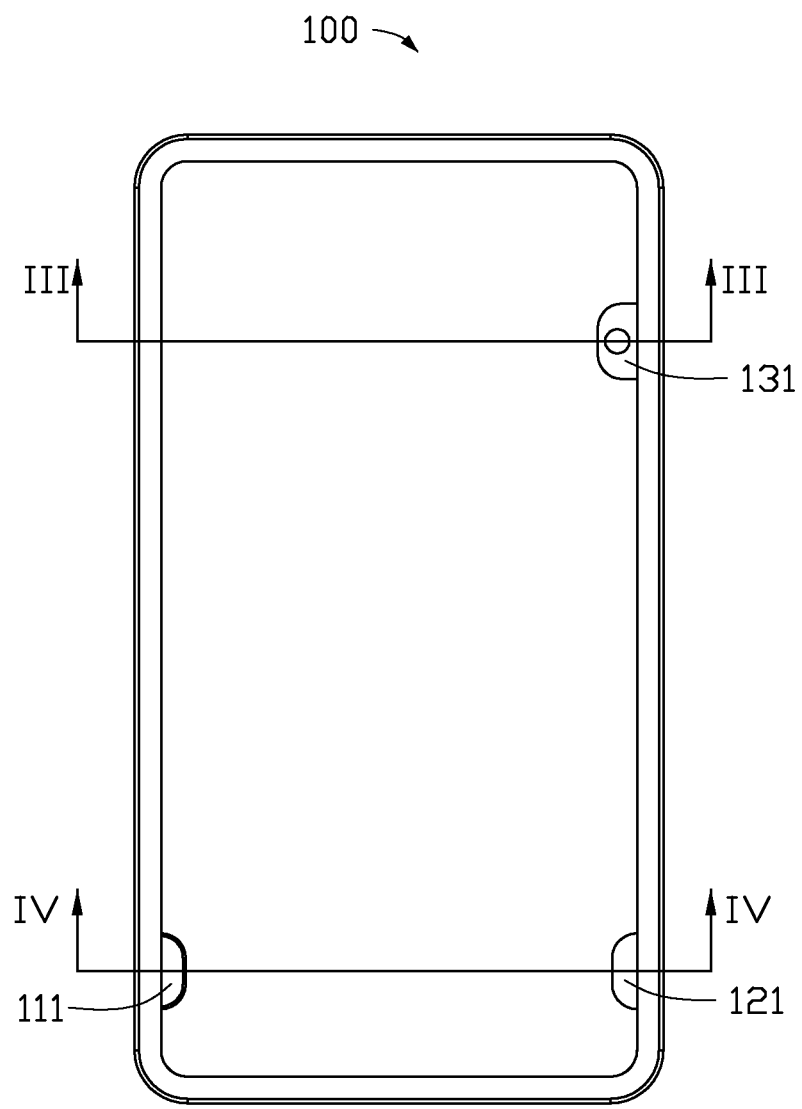
FIG. 1 is a diagrammatic view of an embodiment of a coupling frame.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "inside" indicates that at least a portion of a region is partially contained within a boundary formed by the object. The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising" when utilized, means "including, but not necessarily limited to"; it specifically indicates open-ended inclusion or membership in the so-described combination, group, series and the like.

FIG. 1 illustrates an embodiment of a coupling frame 100 which is configured both to protect the internal electronic components and function as part of an electronic device. The coupling frame 100 can include a first conductive sheet 111 and a second conductive sheet 121 electrically connected to different places of the inside surface of the coupling frame 100, and a support portion 131 extending from the inside surface of the coupling frame 100. The first conductive sheet 111 and the second conductive sheet 121 can be a conductive material and can be coupled to the inside surface of the coupling frame 100 by a soldering procedure. In another embodiment, the first conductive sheet 111 and the second conductive sheet 121 can be integrated with the inside surface of the coupling frame 100. The first conductive sheet 111 and the second conductive sheet 121 can be configured to couple the coupling frame 100 with the inside circuitry. The support portion 131 can be configured to support the internal electronic components.

Figure 2:
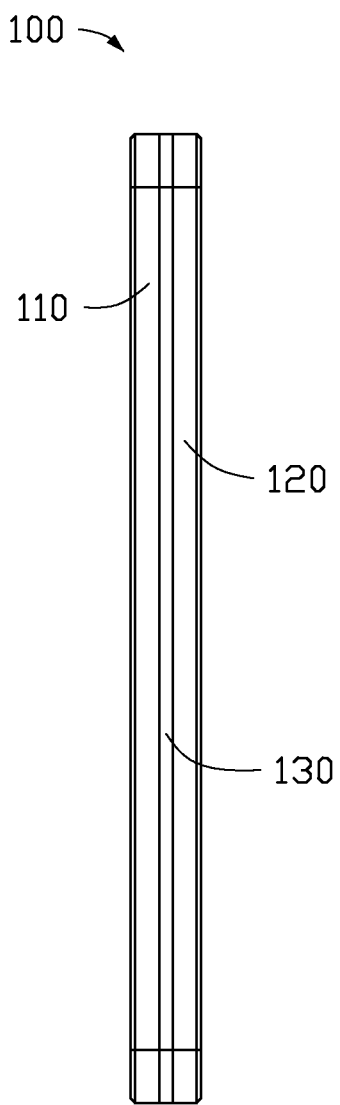
FIG. 2 is a side, elevational view of the coupling frame of FIG. 1.

FIG. 2 illustrates that the coupling frame 100 can include a first conductive frame 110, a second conductive frame 120 and an insulating frame 130. The first conductive frame 110 and the second conductive frame 120 can be made of conductive material and be annular structures. A predetermined gap can be formed between the first conductive frame 110 and the second conductive frame 120. The insulating frame 130 can be made of insulating material and be annular structures. The insulating frame 130 can be sandwiched between the first conductive frame 110 and the second conductive frame 120. The insulating frame 130 can be coupled to the first conductive frame 110 and the second conductive frame 120 by the entire annular surface to increase the contact area and enhance the strength of the connection.

Figure 3:
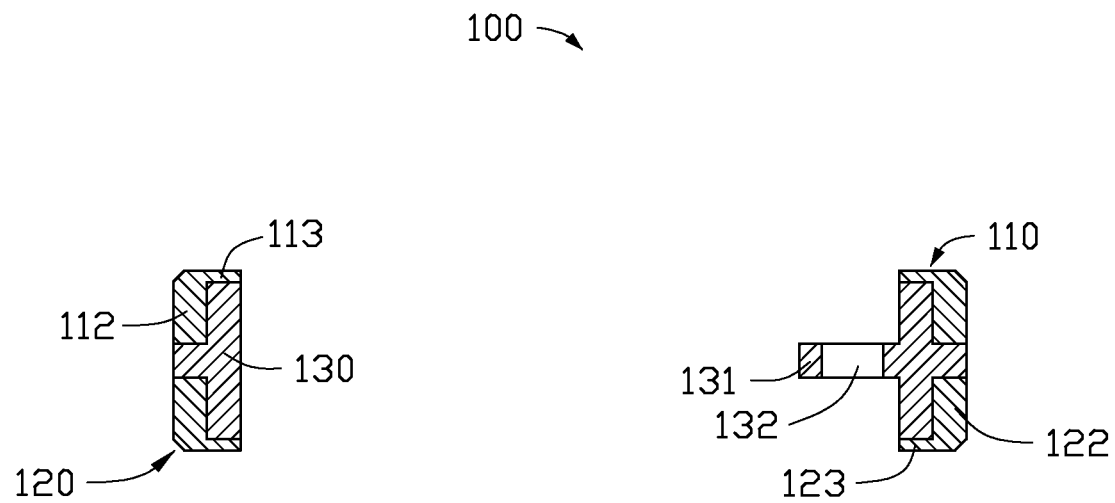
FIG. 3 is a cross-sectional view of the coupling frame taken along a line III-III of FIG. 1.

FIG. 3 illustrates that the first conductive frame 110 can include a first main body 112 and a first extending portion 113 extending inwardly from the first main body 112. The first main body 112 and the first extending portion 113 can form a substantially "L"-shaped semi-closed space to receive the insulating frame 130. The first extending portion 113 can increase the contact area of the insulating frame 130 and the first conductive frame 110 to enhance the structural strength of the insulating frame 130 and the first conductive frame 110. The second conductive frame 120 can include a second main body 122 and a second extending portion 123 extending inwardly from the second main body 122. The second main body 122 and the second extending portion 123 can form a substantially "L"-shaped semi-closed space to receive the insulating frame 130. The second extending portion 123 can increase the contact area of the insulating frame 130 and the second conductive frame 120 to enhance the structural strength of the insulating frame 130 and the second conductive frame 120. That is, a part of the insulating frame 130 can be sandwiched between the first main body 112 of the first conductive frame 110 and the second main body 122 of the second conductive frame 120, and an extended part of the insulating frame 130 can be located between the first extending portion 113 of the first conductive frame 110 and the second extending portion 123 of the second conductive frame 120. The insulating frame 130 can include a support portion 131 extending from an inner surface thereof and a through hole 132 defined on the support portion 131. The support portion 131 can be configured to locate and support the internal electronic components, and the through hole 132 can be configured to tighten the internal electronic components.

Figure 4:
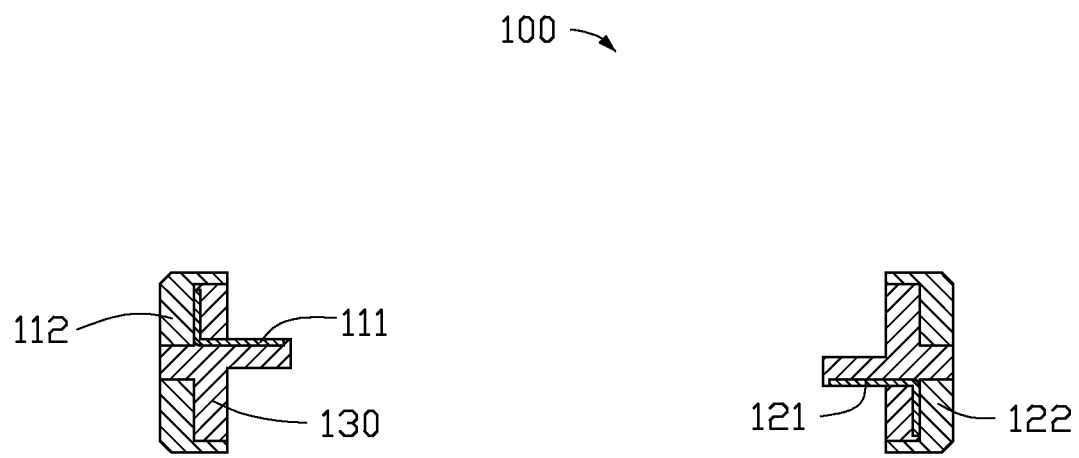
FIG. 4 is a cross-sectional view of the coupling frame taken along a line IV-IV of FIG. 1.

FIG. 4 illustrates that the first conductive sheet 111 and the second conductive sheet 121 can be substantially "L"-shaped. One ends of the first conductive sheet 111 and of the second conductive sheet 121 can be coupled to the different places of the first main body 112 and the second main body 122, and the other ends of the first conductive sheet 111 and of the second conductive sheet 121 can be extended inside the coupling frame 100. In another embodiment, the first conductive sheet 111 and the second conductive sheet 121 can be substantially triangular, or rectangular, or other shape. The insulating frame 130 can extend to partially cover the first conductive sheet 111 and the second conductive sheet 121. The insulating frame 130 can avoid exposure of the first conductive sheet 111 and the second conductive sheet 121 inside the coupling frame 100 and can enhance the structural and connecting strength of the first conductive frame 110 and the second conductive frame 120.

Figure 5:
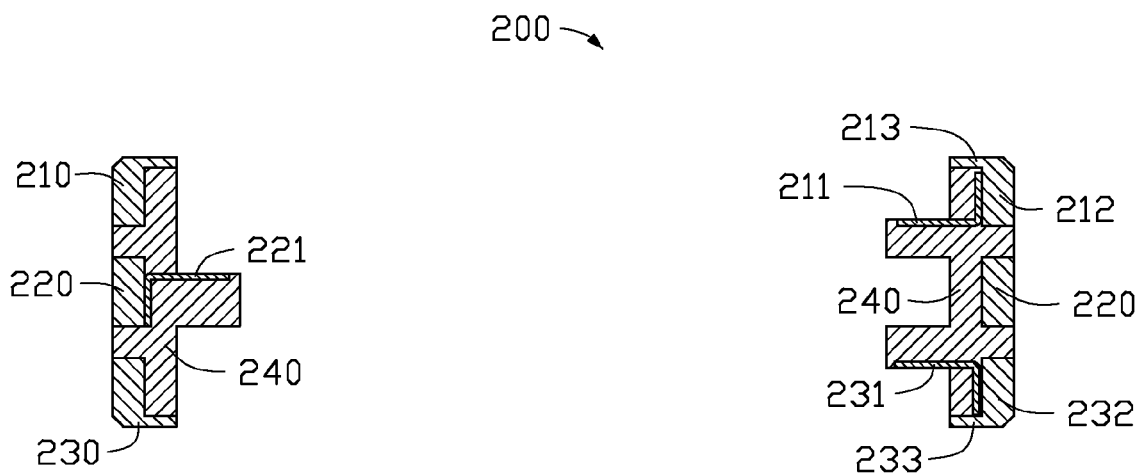
FIG. 5 is a cross-sectional view of another embodiment of a coupling frame.

FIG. 5 illustrates another embodiment of a coupling frame 200. The coupling frame 200 can include a first conductive frame 210, a second conductive frame 220 and a third conductive frame 230. The insulating frame 240 can be arranged between the first conductive frame 210, the second conductive frame 220 and the third conductive frame 230. A first conductive sheet 211, a second conductive sheet 221 and a third conductive sheet 231 can be electrically connected to the different places of the inside surface of the first conductive frame 210, the second conductive frame 220, and the third conductive frame 230. The insulating frame 240 can extend to partially cover the first conductive sheet 211, the second conductive sheet 221 and the third conductive sheet 231. The first conductive frame 210 can include a first main body 212 and a first extending portion 213 extended from the first main body 212. The first extending portion 213 can increase the contact area of the insulating frame 240 and the first conductive frame 210. The second conductive frame 220 can include a main body only. In another embodiment, the quantity of the second conductive frame 220 can be any quantity. The third conductive frame 230 can include a third main body 232 and a third extending portion 233 extended from the third main body 232. The third extending portion 233 can increase the contact area of the insulating frame 240 and the third conductive frame 230. The first extending portion 213 and the third extending portion 233 can be arranged to extend along a same direction. The insulating frame 240 can be arranged between the first extending portion 213 and the third extending portion 233. In another embodiment, the coupling frame 200 can include four or more conductive frames, and an insulating frame can be arranged between any number of conductive frames.

Figure 6:
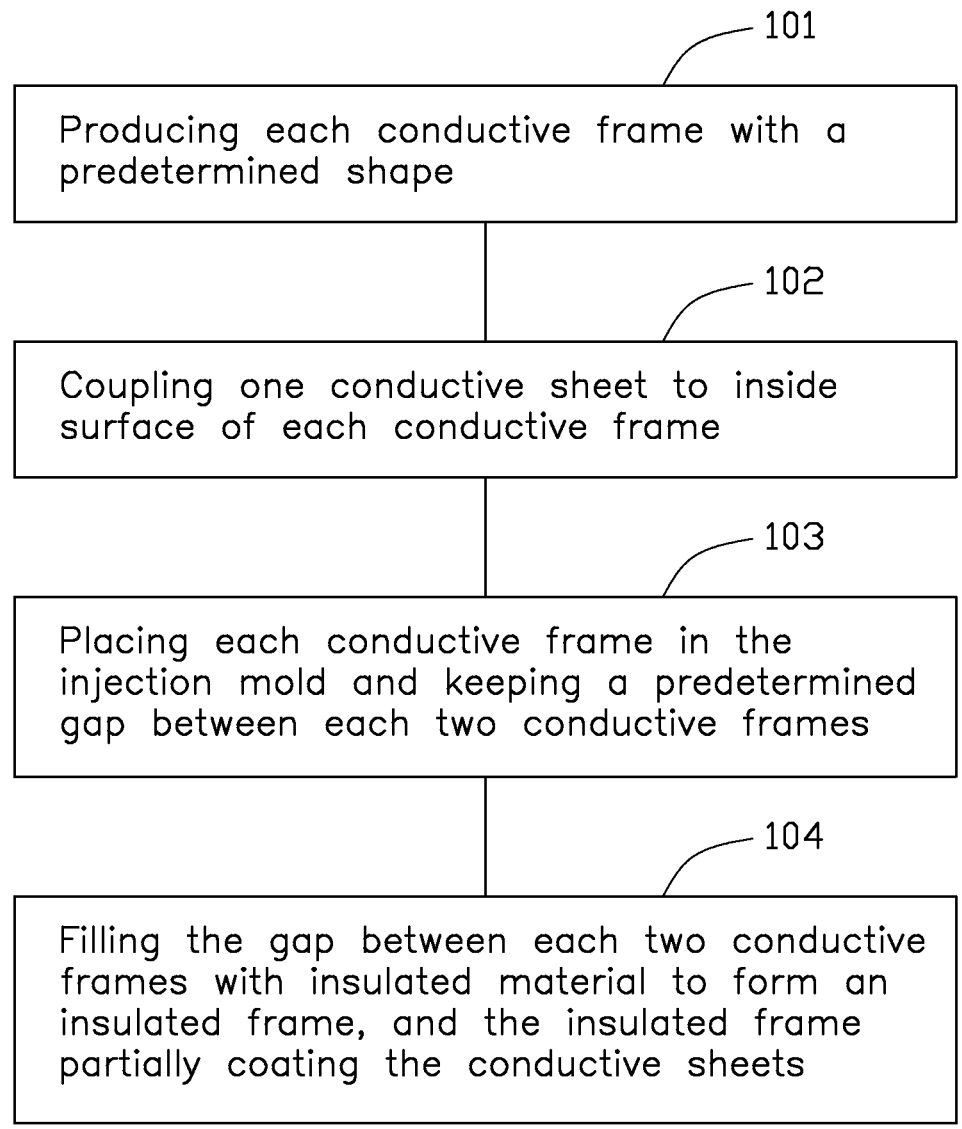
FIG. 6 is a flow chart of a process for a method for making the coupling frame.

FIG. 6 illustrates a flowchart in accordance with an example embodiment. The example method is provided by way of example, as there are a variety of ways to carry out the method. The method described below can be carried out using the configurations illustrated in FIG. 1, for example, and various elements of the figure are referenced in explaining example method. Each block shown in FIG. 6 represents one or more processes, methods or subroutines, carried out in the example method. Additionally, the illustrated order of blocks is by example only and the order of the blocks can change. The example method can begin at block 101.

At block 101, each conductive frame can be made with a predetermined shape.

The conductive frames can be made, and each conductive frame can include a main body and an extending portion extending from the main body, or just include a simple main body.

At block 102, one conductive sheet can be coupled to inside surface of each conductive frame.

Conductive sheets can be coupled to different places inside each conductive frame, thus the coupling frame can electrically connected to the inside circuitry.

At block 103, each conductive frame can be placed in an injection mold and kept a predetermined gap between each two conductive frames.

At block 104, the gap between each two conductive frames can be filled with insulating material to form an insulating frame, the insulating frame can partially cover the conductive sheets.

During the forming work, the molten insulating material can be filled in the gap to form the insulating frame and the insulating frame can extend to partially cover the conductive sheets. The insulating frame can also extend to form a support portion in predetermined places. The support portion can be configured to support the internal electronic components.

The embodiments shown and described above are only examples. Many details are often found in the art such as the other features of a coupling frame. Therefore, many such details are neither shown nor described. Even though numerous characteristics and advantages of the present technology have been set forth in the foregoing description, together with details of the structure and function of the present disclosure, the disclosure is illustrative only, and changes may be made in the details, including in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:
1. A coupling frame comprising:
a plurality of conductive frames spaced from each other by predetermined gaps, each of the plurality of conductive frames having an inside surface;
a plurality of conductive sheets, each of the plurality of conductive sheets being electrically connected to the inside surface of one of the plurality of the conductive frames, and each of the plurality of conductive sheets being electrically connected to different conductive frames; and
an insulating frame filling in the predetermined gaps;
wherein the insulating frame at least partially covers the plurality of conductive sheets.
2. The coupling frame as claimed in claim 1, wherein each conductive frame comprises a main body and an extending portion extending from the main body.
3. The coupling frame as claimed in claim 2, wherein each conductive sheet electrically connects to an inside surface of the main body, and the insulating frame fills in a semi-closed space surrounded by the main body and the extending portion.
4. The coupling frame as claimed in claim 1, wherein the insulating frame comprises a support portion extending from the insulating frame and a through hole defined in the support portion.
5. The coupling frame as claimed in claim 1, wherein one end of each conductive sheet electrically connects to the inside surface of each conductive frame, and the other end of each conductive sheet extends inside the coupling frame.

6. The coupling frame as claimed in claim 1, wherein the coupling frame comprises a first conductive frame, a second conductive frame and a third conductive frame, and the second conductive frame is arranged between the first conductive frame and the third conductive frame.

7. The coupling frame as claimed in claim 6, wherein
the first conductive frame comprises a first main body and a first extending portion extending from the first main body;
the third conductive frame comprises a third main body and a third extending portion extending from the third main body; and
the first extending portion and the third extending portion are arranged to extend along a same direction.

8. The coupling frame as claimed in claim 7, wherein the coupling frame further comprises a first conductive sheet electrically connected to the inside surface of the first main body, a second conductive sheet electrically connected to the inside surface of the second conductive frame and a third conductive sheet electrically connected to the inside surface of the third extending portion.

9. The coupling frame as claimed in claim 8, wherein the insulating frame extends to partially cover the first conductive sheet, the second conductive sheet, and the third conductive sheet.

10. A coupling frame configured to be electrically coupled to internal electronic components of an electronic device, the coupling frame comprising:
a plurality of conductive frames spaced from each other by predetermined gaps, each of the plurality of conductive frames having an inside surface toward an inner space of the electronic device;
a plurality of conductive sheets, each of the plurality of conductive sheets being electrically connected to the inside surface of one of the plurality of the conductive frames and the internal electronic components of the electronic device, and each of the plurality of conductive sheets being electrically connected to different conductive frames; and
an insulating frame filling in the predetermined gaps and coupled to the inside surfaces the plurality of conductive frames;

wherein the insulating frame extends toward the inner space of the electronic device to at least partially overlap with the plurality of conductive sheets.

11. The coupling frame as claimed in claim 10, wherein each conductive frame comprises a main body and an extending portion extending from the main body.

12. The coupling frame as claimed in claim 10, wherein each conductive sheet electrically connects to an inside surface of the main body, and the insulating frame fills in a semi-closed space surrounded by the main body and the extending portion.

13. The coupling frame as claimed in claim 10, wherein the insulating frame comprises a support portion extending from the insulating frame and a through hole defined in the support portion.

14. The coupling frame as claimed in claim 10, wherein one end of each conductive sheet electrically connects to the inside surface of each conductive frame, and the other end of each conductive sheet extends inside the coupling frame.

15. The coupling frame as claimed in claim 10, wherein the coupling frame comprises a first conductive frame, a second conductive frame and a third conductive frame, and the second conductive frame is arranged between the first conductive frame and the third conductive frame.

16. The coupling frame as claimed in claim 15, wherein
the first conductive frame comprises a first main body and a first extending portion extending from the first main body;
the third conductive frame comprises a third main body and a third extending portion extending from the third main body; and
the first extending portion and the third extending portion are arranged to extend along a same direction.

17. The coupling frame as claimed in claim 16, wherein the coupling frame further comprises a first conductive sheet electrically connected to the inside surface of the first main body, a second conductive sheet electrically connected to the inside surface of the second conductive frame and a third conductive sheet electrically connected to the inside surface of the third extending portion.

* * * * *